(12) United States Patent
Fulford

(10) Patent No.: US 6,195,873 B1
(45) Date of Patent: Mar. 6, 2001

(54) METHOD FOR DECREASING CONTACT RESISTANCE

(75) Inventor: H. Jim Fulford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/392,356

(22) Filed: Sep. 8, 1999

(51) Int. Cl.[7] .................................................. H01H 11/00
(52) U.S. Cl. ......................... 29/622; 29/852; 257/773; 257/758
(58) Field of Search ............................ 29/852, 610, 620, 29/622; 257/773, 774, 758, 764; 438/640, 424, 427; 427/97

(56) References Cited

U.S. PATENT DOCUMENTS

| 5,323,520 | * | 6/1994 | Peters ................................. 29/25.42 |
| 6,016,011 | * | 1/2000 | Cao ....................................... 257/773 |
| 6,043,151 | * | 3/2000 | Gonzalaz et al. ................. 438/672 |
| 6,064,119 | * | 5/2000 | Jun et al. ............................ 257/773 |
| 6,114,244 | * | 9/2000 | Hirose ................................. 438/688 |

FOREIGN PATENT DOCUMENTS

| 57-93568 | * | 6/1982 | (JP) . |
| 3-276763 | * | 12/1991 | (JP) . |

* cited by examiner

Primary Examiner—Lee Young
Assistant Examiner—Sean Smith
(74) Attorney, Agent, or Firm—Williams, Morgan & Amerson, P.C.

(57) ABSTRACT

A method for forming an electrical contact is provided. A base layer having a conductive member is provided. An intermediate layer is formed over at least the conductive member. A photoresist layer is formed and patterned over at least a portion of the intermediate layer to define a contact patterning region above the conductive member. An amount of overlay between the contact patterning region and the conductive member is measured. A size of a contact opening is determined based on the amount of overlay. The contact opening of the determined size is formed in the intermediate layer. The contact opening communicates with the conductive member.

17 Claims, 4 Drawing Sheets

METHOD FOR DECREASING CONTACT RESISTANCE

BACKGROUND OF THE INVENTION

1. Field of the Invention

This invention relates generally to semiconductor manufacturing, and more particularly, to a method for decreasing contact resistance in a semiconductor device.

2. Description of the Related Art

A conventional integrated circuit device, such as a microprocessor, is typically comprised of many thousands of semiconductor devices, e.g., transistors, formed above the surface of a semiconductive substrate. For the integrated circuit device to function, the transistors must be electrically connected to one another through conductive interconnections. Many modern integrated circuit devices are very densely packed, i.e., there is very little space between the transistors formed above the substrate. Thus, these conductive interconnections must be made in multiple layers to conserve plot space on the semiconductive substrate.

The conductive interconnections are typically accomplished through the formation of a plurality of conductive lines and conductive plugs, commonly referred to as contacts or vias, formed in alternative layers of dielectric materials formed on the device. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, polysilicon, etc. A contact is generally used to define an interconnection (e.g., using polysilicon or metal) to an underlying polysilicon layer, while a via denotes a metal to metal interconnection. In either case, a contact opening is formed in an insulating layer overlaying the conductive member. Typically, photoresist is deposited over the insulating layer and selectively patterned to define contact patterning regions. The exposed photoresist is removed, leaving a portion of the insulating layer exposed. The exposed portion of the insulating layer is then anisotropically etched to extend the opening to reach the underlying conductive member. A second conductive layer is then formed over the contact opening and electrical communication is established with the contact member.

The volume of the contact determines the contact resistance of the interconnection. A higher contact resistance correlates to a slower device. Commonly, the contact opening is defined smaller than the underlying conductive member to allow some overlay between the conductive member and the photoresist mask. Overlay as used herein refers to the degree to which the contact opening is aligned with the underlying conductive member. A good overlay is reflected in the contact opening being centered over the conductive member, while a less desirable overlay is skewed in one or more directions toward the edges of the conductive member. If the contact opening is misaligned, the contact may be formed sufficiently close to an adjacent device to interfere with its operation. Such a condition may require that the device be scrapped. Thus, there exists a trade-off between contact size (i.e., affects device speed) and acceptable overlay (i.e., affects defect count). If the contact area is increased, the propensity for defects is also increased.

The present invention is directed to overcoming, or at least reducing the effects of, one or more of the problems set forth above.

SUMMARY OF THE INVENTION

One aspect of the present invention is seen in a method for forming an electrical contact. A base layer having a conductive member is provided. An intermediate layer is formed over at least the conductive member. A photoresist layer is formed and patterned over at least a portion of the intermediate layer to define a contact patterning region above the conductive member. An amount of overlay between the contact patterning region and the conductive member is measured. A size of a contact opening is determined based on the amount of overlay. The contact opening of the determined size is formed in the intermediate layer. The contact opening communicates with the conductive member.

BRIEF DESCRIPTION OF THE DRAWINGS

The invention may be best understood by reference to the following description taken in conjunction with the accompanying drawings, in which like reference numerals identify like elements, and in which.

Figure 1:
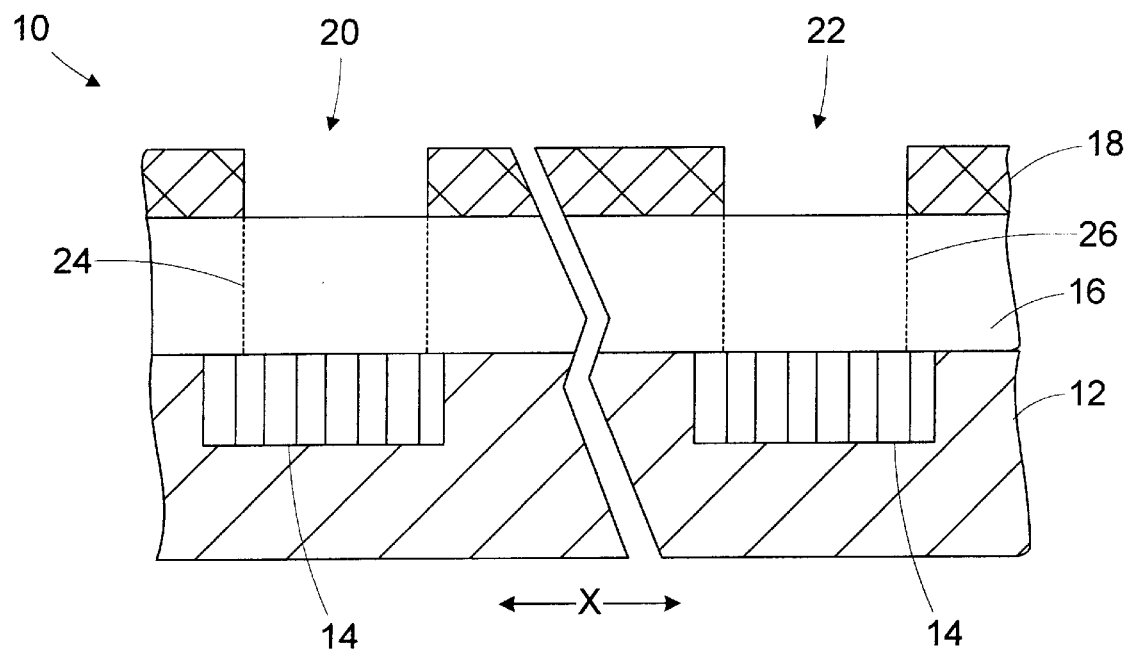
FIG. 1 is a cross-section view of a semiconductor device with a photoresist contact opening pattern formed thereon.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the figures, and first to FIG. 1, a cross-section view of a semiconductor device 10 is provided. The semiconductor device 10 includes a base layer 12 with conductive members 14 (e.g., polysilicon or metal) formed therein. The base layer 12 may be a substrate or may be the top layer of some other underlying device topology. An insulating layer 16 (e.g., silicon dioxide or silicon nitride) is formed over the conductive members 14. A photoresist layer 18 is formed over the insulating layer 16. Contact patterning regions 20, 22 are patterned and developed in the photoresist layer 18.

Before etching through the insulating layer 16 to define contact openings, the amount of overlay between the conductive members 14 and the contact patterning regions 20, 22 is measured. A KLA 5015 Coherence Probe Metrology System, KLA 5100, or KLA 5200, sold by KLA-Tencor Corporation are exemplary devices suitable for measuring the amount of overlay. Although FIG. 1 shows the overlay in one dimension (e.g., the X direction), it will be appreciated that overlay is also present in the dimension not shown (i.e., the Y direction—into the page).

The edges of the contact opening that would normally be formed based on the contact patterning regions 20, 22 are denoted by dashed lines 24, 26. Notice that the contact patterning region 22 is better aligned (e.g., centered over the conductive member 14) than the contact patterning region 20. It will be appreciated that all of the contact patterning regions 20, 22 on a single die (not shown) or wafer (not shown) may be similar due to the uniform processing thereof. The two contact patterning regions 20, 22, with different amounts of overlay, are provided for illustrative purposes.

Figure 2:
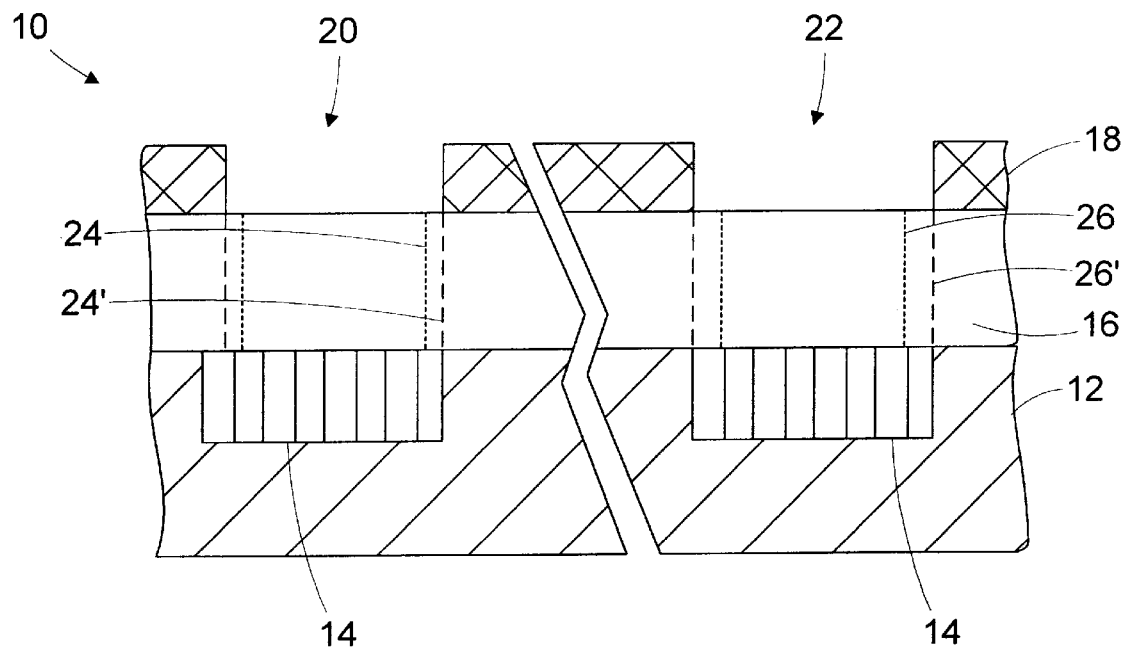
FIG. 2 is a cross-section view of the device of FIG. 1 with the photoresist contact opening pattern widened based on the amount of overlay.

Based on the overlay measurements, the photoresist layer 18 is etched to widen the contact patterning regions 20, 22, as represented by dashed line 24', 26' depicted in FIG. 2. The amount of widening is limited by the amount of overlay in both X and Y directions. For example, if the overlay in the X direction is 5 nanometers and the overlay in the Y direction is 3 nanometers, the maximum widening is determined by the limiting overlay, that is, 3 nanometers. In the case of the contact patterning region 20, the photoresist layer 18 may be widened until the edge 24' reaches the edge of the conductive member 14. Likewise, the photoresist layer 18 near the contact patterning region 20, 22 may be widened until the edge 26' reaches the edge of its respective conductive member 14. Because the contact patterning region 22 is better aligned, it may be widened further than the contact patterning region 20. Depending on the specific topology of the semiconductor device 10, it may be possible to widen the contact patterning regions 20, 22 past the edges 27 of the conductive members 14 without deleteriously affecting adjacent circuit elements (not shown).

An exemplary process suitable for widening the contact patterning regions 20, 22 formed in the photoresist layer 18 is an isotropic plasma etch using $CF_4$ or $CHF_3$. A suitable tool for performing such an etch is an AMAT 5300 offered by Applied Materials, Inc. The isotropic plasma etch tends to actually round the corners of the contact patterning regions 20, 22 rather than uniformly widening the contact patterning regions 20, 22. However, uniform widening is shown in FIG. 2 for ease of illustration.

Figure 3:
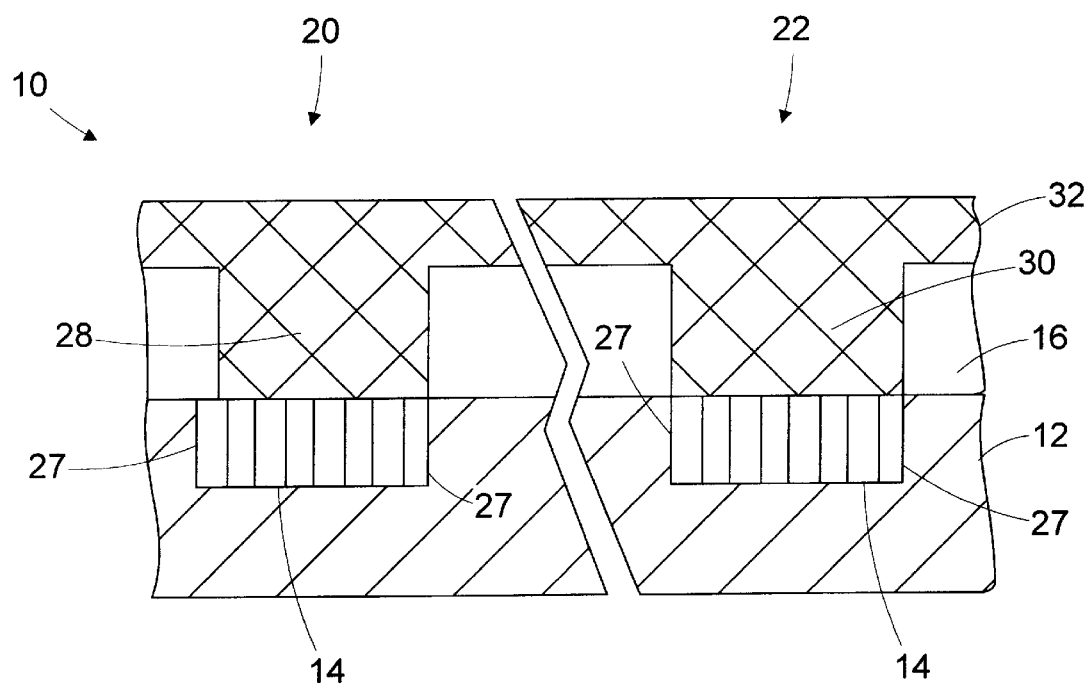
FIG. 3 is a cross-section view of the device of FIG. 1 with the contact opening formed.

As shown in FIG. 3, after widening of the contact patterning regions 20, 22, contact openings 28, 30 may be etched through the insulating layer 16 using an anisotropic etch suitable for the material forming the insulating layer 16. For example, an anisotropic etch using Ar, $C_2F_6$, and $C_4F_8$ may be used in conjunction with the AMAT 5300. A conductive layer 32 (e.g., metal or polysilicon) is then formed over the contact openings 28, 30 to establish electrical communication with the conductive members 14. Subsequent processing (not shown) may then be performed to complete the manufacture of the semiconductor device 10.

Figure 4:
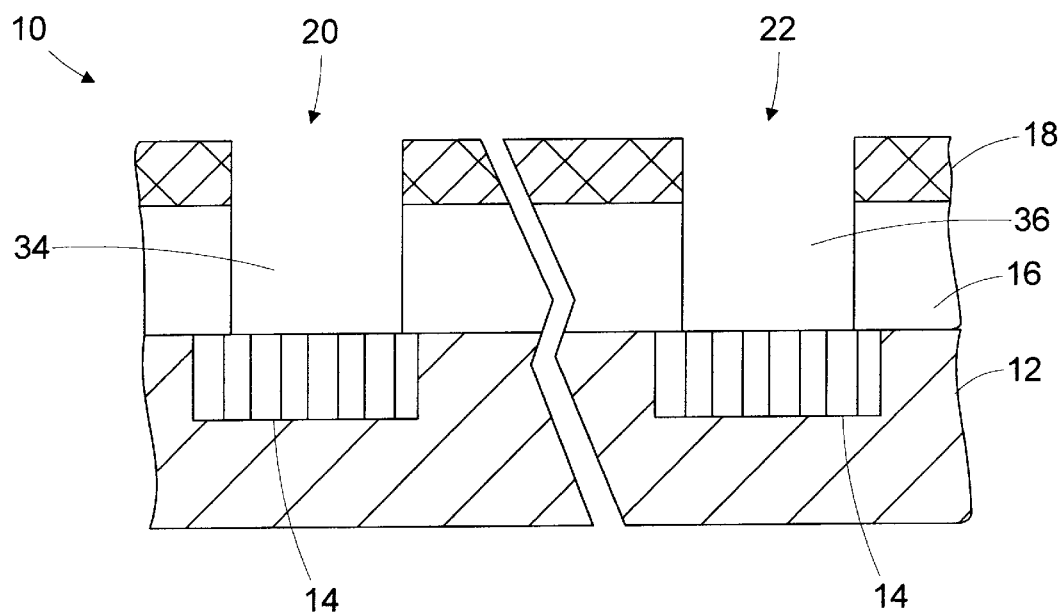
FIG. 4 is a cross-section view of the device of FIG. 3 with the contact opening widened based on the amount of overlay.
Figure 5:
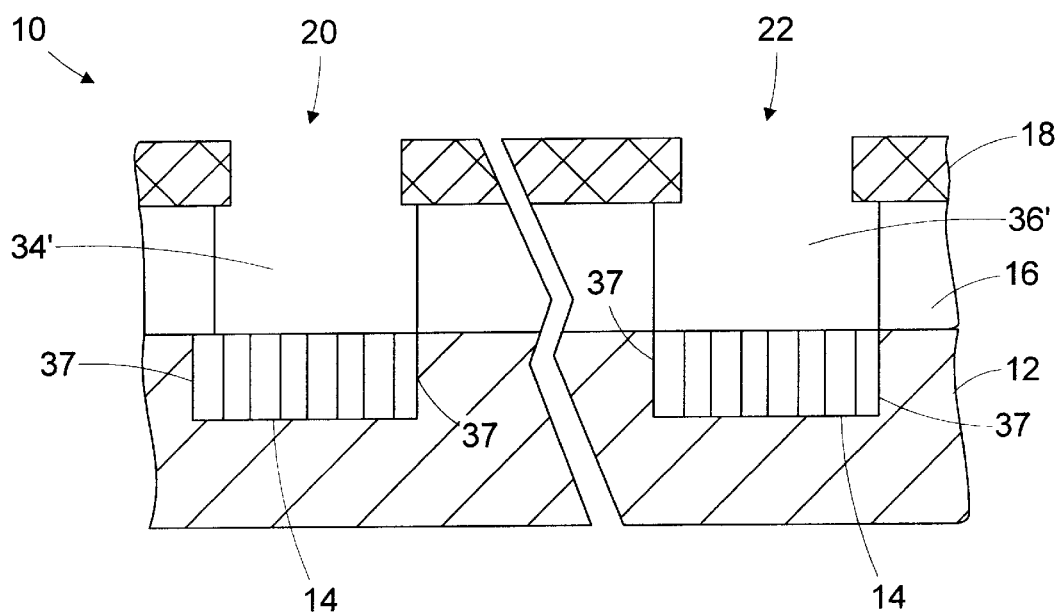
FIG. 5 is a cross-section of the device of FIGS. 2 and 4 with a contact layer formed over the contact openings.

Turning now to FIG. 4, an alternative method for forming a widened contact opening is provided. In FIG. 4, the contact openings 34, 36 are etched through the insulating layer 16 based on the original patterning of the photoresist layer 18. Typically, one or more cleaning etches are performed to after the anisotropic etch, for example, to remove polymer material from the sidewalls and bottom of the contact openings 28, 30. After such cleaning the overlay measurements are used to control an isotropic etch process that undercuts the photoresist layer 18 and forms widened contact openings 34', 36' as shown in FIG. 5. The specific etchant used to widen the contact openings 34, 36 depends on the makeup of the insulating layer 16. Again, the widened contact openings 34', 36' may be widened past the edges 37 of the conductive members 14 provided the etchant does not affect the base layer 12 and such widening does not deleteriously affect adjacent circuit elements (not shown).

The isotropic plasma etch using $CF_4$ or $CHF_3$ described above may also be used to widen the contact openings 34, 36. However, such a plasma etch will widen both the insulating layer 16 and the photoresist layer 18. Other etchants that only etch the insulating layer 16 may also be used (as shown in FIG. 5).

After widening of the contact openings 34', 36' the photoresist layer 18 may be removed and a conductive layer may be formed in and over the contact openings 34', 36' to form a device similar to that depicted in FIG. 3.

Figure 6:
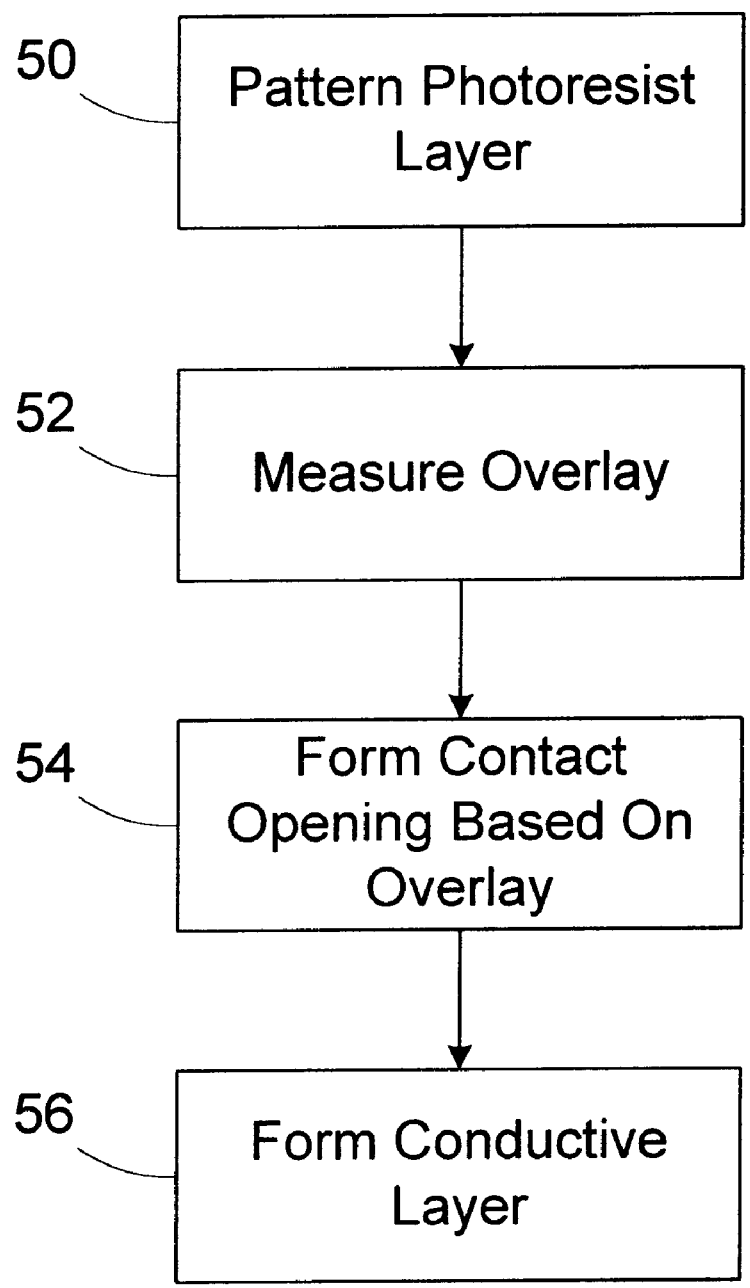
FIG. 6 is a flow diagram of a method for forming an electrical contact in accordance with the present invention.

Referring to FIG. 6, a flow diagram of a method for forming an electrical contact in accordance with the present invention is provided. In block 50, a photoresist layer is patterned (i.e., exposed and developed) to form the contact patterning regions 20,22. The amount of overlay between the contact patterning regions 20, 22 and the underlying conductive members 14 is measured in block 52. In block 54, contact openings, such as contact openings 28, 30, 34, 36, are formed based on the overlay measurements. In one exemplary embodiment described above, forming the contact opening includes widening the contact patterning regions 20, 22 in the photoresist layer 18 prior to forming the contact openings 28, 30. In the other exemplary embodiment described above, forming the contact opening includes forming the contact openings 34, 36 based on the original contact patterning regions 20, 22 and using an isotropic etch to form the widened contact openings 34', 36'. In block 56, the conductive layer 32 is formed in and over the contact openings 28, 30, 34', 36' to establish electrical communication with the conductive members 14.

Forming the contact openings 28, 30, 34', 36' as described above reduces the contact resistance by increasing the cross-sec+ional area of the formed contact. This increases the potential speed of the semiconductor device 10. It is contemplated that the overlay measurement may be performed on every wafer in a lot or on a representative sample of the wafers within a lot. Accordingly, the process parameters for widening the contact openings 28, 30, 34, 36 (e.g., photoresist etch or insulator etch) may be modified for each wafer, or for each lot of wafers. Other measurement frequencies may also be used.

The particular embodiments disclosed above are illustrative only, as the invention may be modified and practiced in different but equivalent manners apparent to those skilled in the art having the benefit of the teachings herein. Furthermore no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming an electrical contact, comprising:

providing a base layer having a conductive member;

forming an intermediate layer over at least the conductive member;

forming and patterning a photoresist layer over at least a portion of the intermediate layer to define a contact patterning region above the conductive member;

measuring an amount of overlay between the contact patterning region and the conductive member;

determining a size of a contact opening based on the amount of overlay; and forming the contact opening of the determined size in the intermediate layer, the contact opening communicating with the conductive member.

2. The method of claim 1, wherein forming the contact opening comprises:

widening the contact patterning region based on the amount of overlay; and etching the intermediate layer through the widened contact patterning region.

3. The method of claim 2, wherein widening the contact patterning region comprises plasma etching the contact patterning region.

4. The method of claim 3, wherein plasma etching the contact patterning region includes using a plasma containing at least one of $CF_4$ and $CHF_3$.

5. The method of claim 2, wherein forming the contact opening comprises:

etching the intermediate layer through the contact patterning region to define an intermediate contact opening; and widening the intermediate contact opening based on the amount of overlay.

6. The method of claim 5, wherein widening the intermediate contact opening comprises isotropically etching the intermediate contact opening.

7. The method of claim 6, wherein isotropically etching the contact patterning region includes using a plasma containing at least one of $CF_4$ and $CHF_3$.

8. The method of claim 1, further comprising forming a conductive layer over the contact opening.

9. The method of claim 8, wherein forming the conductive layer comprises forming at least one of a polysilicon layer and a metal layer.

10. The method of claim 1, wherein forming the intermediate layer comprises forming an insulative layer.

11. The method of claim 10 wherein forming the insulative layer comprises forming at least one of a silicon dioxide layer and a silicon nitride layer.

12. The method of claim 1, wherein providing the base layer includes providing the base layer having the conductive member, the conductive member comprising polysilicon.

13. The method of claim 1, wherein measuring the amount of overlay includes measuring a first amount of overlay in a first direction and measuring a second amount of overlay in a second direction.

14. The method of claim 13, wherein forming the contact opening comprises forming the contact opening based on the smaller of the first and second amounts of overlay.

15. The method of claim 1, wherein measuring the amount of overlay comprises measuring the distance between an edge of the contact patterning region and an edge of the conductive member.

16. The method of claim 15, wherein forming the contact opening comprises forming the contact opening based on the amount of overlay, the contact opening overlapping at least one edge of the conductive member.

17. The method of claim 15, wherein forming the contact opening comprises forming the contact opening based on the amount of overlay without overlapping the edge of the conductive member.

* * * * *